United States Patent
Moder et al.

(10) Patent No.: US 9,875,926 B2
(45) Date of Patent: Jan. 23, 2018

(54) SUBSTRATES WITH BURIED ISOLATION LAYERS AND METHODS OF FORMATION THEREOF

(71) Applicant: Infineon Technologies AG, Neubiberg (DE)

(72) Inventors: Iris Moder, Villach (AT); Ingo Muri, Villach (AT); Johannes Baumgartl, Riegersdorf (AT); Oliver Hellmund, Neubiberg (DE); Manfred Engelhardt, Villach-Landskron (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/953,362

(22) Filed: Nov. 29, 2015

(65) Prior Publication Data
US 2017/0154808 A1   Jun. 1, 2017

(51) Int. Cl.
*H01L 21/76*   (2006.01)
*H01L 21/762*   (2006.01)
*H01L 21/20*   (2006.01)
*H01L 21/02*   (2006.01)

(52) U.S. Cl.
CPC .. *H01L 21/76267* (2013.01); *H01L 21/76283* (2013.01); *H01L 21/02647* (2013.01); *H01L 21/2022* (2013.01); *H01L 21/76248* (2013.01); *H01L 21/76264* (2013.01); *H01L 21/76272* (2013.01); *H01L 21/76281* (2013.01); *H01L 21/76286* (2013.01); *H01L 21/76289* (2013.01); *H01L 21/76297* (2013.01)

(58) Field of Classification Search
CPC ........... H01L 21/0254; H01L 21/02458; H01L 21/0262; H01L 29/2003; H01L 33/32; H01L 21/02647; H01L 33/007; H01L 21/02639; H01L 21/0237; H01L 21/02433; H01L 21/02609; H01L 33/20
USPC ......................................................... 438/429
See application file for complete search history.

(56) References Cited

U.S. PATENT DOCUMENTS

| | | | | |
|---|---|---|---|---|
| 4,760,036 A | * | 7/1988 | Schubert | ........... H01L 21/76248 117/89 |
| 4,889,829 A | | 12/1989 | Kawai | |
| 5,308,445 A | * | 5/1994 | Takasu | ................ H01L 21/7602 117/90 |
| 5,710,057 A | | 1/1998 | Kenney | |
| 6,551,944 B1 | * | 4/2003 | Fallica | .................. H01L 21/763 148/33.2 |

(Continued)

OTHER PUBLICATIONS

Grant N.E., "Low Temperature Anodically Grown Silicon Dioxide Films for Solar Cell Applications," 57 pages.

(Continued)

*Primary Examiner* — Vu A Vu
(74) *Attorney, Agent, or Firm* — Slater Matsil, LLP

(57) ABSTRACT

A method for fabricating a semiconductor device includes forming an opening in a first epitaxial lateral overgrowth region to expose a surface of the semiconductor substrate within the opening. The method further includes forming an insulation region at the exposed surface of the semiconductor substrate within the opening and filling the opening with a second semiconductor material to form a second epitaxial lateral overgrowth region using a lateral epitaxial growth process.

25 Claims, 16 Drawing Sheets

(56) References Cited

U.S. PATENT DOCUMENTS

| | | | | |
|---|---|---|---|---|
| 6,670,257 | B1* | 12/2003 | Barlocchi | H01L 21/2007 257/E21.122 |
| 6,940,098 | B1* | 9/2005 | Tadatomo | C30B 25/02 257/190 |
| 7,557,002 | B2* | 7/2009 | Wells | H01L 21/3221 257/E21.017 |
| 7,888,201 | B2* | 2/2011 | Yeo | H01L 21/84 257/E21.661 |
| 8,008,170 | B2* | 8/2011 | Liang | H01L 21/0242 257/64 |
| 8,334,188 | B2* | 12/2012 | Villa | H01L 21/3003 257/E21.573 |
| 8,574,968 | B2* | 11/2013 | Arena | H01L 21/0237 257/E21.04 |
| 8,598,713 | B2* | 12/2013 | Blaschke | H01L 21/743 257/659 |
| 2002/0001965 | A1 | 1/2002 | Forbes | |
| 2002/0094663 | A1 | 7/2002 | Kwon et al. | |
| 2011/0101452 | A1* | 5/2011 | Sonsky | H01L 21/3247 257/334 |
| 2011/0147883 | A1 | 6/2011 | Schulze et al. | |
| 2013/0228876 | A1* | 9/2013 | Mor | H01L 29/66545 257/401 |

OTHER PUBLICATIONS

Kim et al., "In-Situ Monitoring of Anodic Oxidation of P-Type Si(100) by Electrochemical Impedance Techniques in Nonaqueous and Aqueous Solutions," Bull. Korean Chem. Soc. 1999, vol. 20, No. 9, pp. 1049-1055.

Shareef et al., "Subatmospheric Chemical Vapor Depositon Ozone/TEOS Process for SiO2 Trench Filling," Jul./Aug. 1995, 5 pages.

Zytkiewicz, Z.R., "Laterally Overgrown Structures as Substrates for Lattice Mismatched," Thin Solid Films 412, 2002, pp. 64-75.

Wikipedia, "Silicon on insulator," https://en.wikipedia.org/w/index.php@title=Silicon_on_insulator&oldid-681360297, downloaded Oct. 17, 2015, 2 pages.

* cited by examiner

US 9,875,926 B2

SUBSTRATES WITH BURIED ISOLATION LAYERS AND METHODS OF FORMATION THEREOF

TECHNICAL FIELD

The present invention relates generally to a semiconductor processing, and, in particular embodiments, to substrates with buried isolation layers and methods of formation thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

Semiconductor devices are fabricated on semiconductor wafers, which are usually bulk semiconductor wafer. Bulk semiconductor wafers are formed using a Czochralski, float zone, or other processes. Semiconductor on insulator (SOI) substrate is another type of substrate that is gaining popularity. These substrates are being increasingly favored for the possibility of improved isolation of the device regions and result in devices with reduced leakage currents and parasitic effects. However, manufacturing SOI wafers requires additional processing of the bulk wafers. For example, SOI wafers are formed using an oxygen implantation such as in a SIMOX process, or using wafer bonding processes such as Smart Cut process in which two substrates are bonded together. Consequently, the manufacturing costs of producing SOI wafers are much higher than conventional bulk wafers. Additionally, due to the difficulty of the fabrication process, the supply of these wafers is limited. Further, the bottom layer of the SOI wafer cannot be contacted electrically using conventional contact forming processes.

SUMMARY

In accordance with an embodiment of the present invention, a method for fabricating a semiconductor device comprises forming an opening in a first epitaxial lateral overgrowth region to expose a surface of the semiconductor substrate within the opening. The method further comprises forming an insulation region at the exposed surface of the semiconductor substrate within the opening; and using a lateral epitaxial growth process, filling the opening with a second semiconductor material to form a second epitaxial lateral overgrowth region.

In accordance with an alternative embodiment of the present invention, a method for fabricating a semiconductor device, the method includes forming a plurality of first openings and plurality of pillars in a semiconductor substrate using an anisotropic etching process. Each of the plurality of first openings is spaced from another one of the plurality of first openings by one of the plurality of pillars. The method further includes forming a plurality of second openings in the semiconductor substrate by extending through the plurality of first openings using an isotropic etching process; treating exposed surfaces of the semiconductor substrate at the plurality of second openings to form a conformal liner; and using a lateral epitaxial growth process, growing a epitaxial lateral overgrowth region in the plurality of first openings from the plurality of pillars of the semiconductor substrate.

In accordance with an alternative embodiment of the present invention, a method includes forming a plurality of mask regions over a semiconductor substrate. The plurality of mask regions exposes portions of the semiconductor substrate while covering other portions of the semiconductor substrate. Using a lateral epitaxial growth process, an epitaxial lateral overgrowth region is formed through the exposed portions of the semiconductor substrate. The method further includes forming a plurality of openings in the epitaxial lateral overgrowth region; and forming a buried cavity in the epitaxial lateral overgrowth region.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A, 1B, 2A, 2B, 2C, 3A, 3B, 3C, 3D, 3E, 4, 5, and 6 illustrate an embodiment of fabricating the semiconductor device comprising a buried insulation layer in accordance with embodiments of the invention, wherein FIG. 1A illustrates a cross-sectional view of a semiconductor substrate after forming a first mask, wherein FIG. 1B illustrates an exemplary embodiment of the top view of the semiconductor substrate during fabrication, wherein FIG. 2A illustrates the semiconductor device after forming an epitaxial lateral overgrowth layer, wherein FIG. 2B illustrates the semiconductor device after forming a second mask and patterning the epitaxial lateral overgrowth layer, wherein FIG. 2C illustrates the semiconductor device after forming an insulation layer between the openings in the second mask, wherein FIGS. 3A-3E illustrate a method of forming an insulation layer at the bottom surface of the opening, wherein FIG. 3A illustrates a semiconductor device after forming a conformal liner in a high aspect ratio opening, wherein FIG. 3B illustrates a semiconductor device after forming a conformal liner, wherein FIG. 3C illustrates a semiconductor device after polishing the fill material, wherein FIG. 3D illustrates a semiconductor device after etching the conformal liner, wherein FIG. 3E illustrates a semiconductor device after removing the fill material, wherein FIG. 4 illustrate an alternative method of forming an insulation layer at the bottom surface of the opening, wherein FIG. 5 illustrates the semiconductor device after forming another epitaxial lateral overgrowth layer between the openings in the second mask, wherein FIG. 6 illustrates the semiconductor device after planarization of the second epitaxial lateral overgrowth layer;

FIGS. 8-10 illustrates a semiconductor device during various stages of fabrication in accordance with embodiments of the present invention, wherein FIG. 8 illustrates the semiconductor device after removing the insulation layer, wherein FIG. 9 illustrates the semiconductor device after forming an insulation layer at the bottom of the openings, wherein

FIGS. 11-19 illustrate a semiconductor device during various stages of fabrication in accordance with an alternative embodiment of the present invention, wherein FIG. 11 illustrates the semiconductor device after forming an etch mask over the substrate, wherein FIG. 12 illustrates the semiconductor device after forming deep openings in the substrate, Wherein FIG. 13 illustrates the semiconductor device after passivating the sidewalls of the deep opening, wherein FIG. 14 illustrates the semiconductor device after an isotropic etching process, wherein FIG. 15 illustrates the semiconductor device after forming a sidewall liner on the lower openings, wherein FIG. 16 illustrates the semiconductor device after filling the lower openings, wherein FIG. 17 illustrates the semiconductor device after removing the sidewall passivation from the deep opening, wherein FIG. 18 illustrates the semiconductor device after filling the deep opening with a epitaxial lateral overgrowth layer, wherein FIG. 19 illustrates the semiconductor device after planarization in accordance with an embodiment of the present invention;

DETAILED DESCRIPTION OF ILLUSTRATIVE EMBODIMENTS

Embodiments of the present invention disclose various methods of forming substrates with buried isolation regions without the disadvantages of conventional SOI wafers. In various embodiments, buried isolation regions are formed without the additional process complexity associated with forming SOI wafers. Advantageously, embodiments of the present invention use a bulk semiconductor wafer as the starting substrate. This avoids the higher costs and availability issues related to conventional SOI wafers. Further, using readily available process steps and without expensive process steps or equipment, a conventional substrate is converted into a SOI-like substrate.

Various embodiments of the present invention disclose different ways to form a buried isolation layer within a bulk substrate. The following description describes the various embodiments. Embodiments for producing a buried isolation using an epitaxial lateral overgrowth processes will be described using FIGS. 1-6. Another embodiment of producing a buried cavity and optionally a buried isolation will be described using FIGS. 8-10. An alternative embodiment of producing a buried isolation using an isotropic etching process will be described using FIGS. 11-19. FIG. 7 illustrates a top view to illustrate possible structural relationship between the multiple epitaxial lateral overgrowth layers.

FIGS. 1A, 1B, 2A, 2B, 2C, 3A, 3B, 3C, 3D, 3E, 4, 5, and 6 illustrate an embodiment of fabricating the semiconductor device comprising a buried insulation layer in accordance with embodiments of the invention.

Figure 1A:
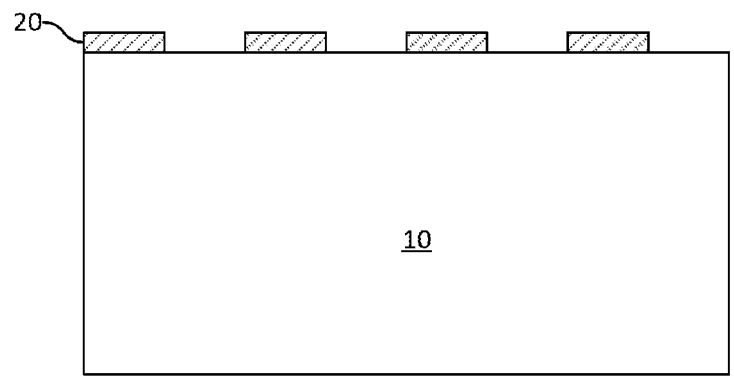

FIG. 1A illustrates a cross-sectional view of a semiconductor substrate after forming a first mask in accordance with an embodiment of the present invention.

Referring to FIG. 1A, the substrate 10 may be a semiconductor substrate in various embodiments. The substrate 10 may be a semiconductor bulk substrate or a semiconductor on insulator substrate in some embodiments. Some examples of the substrate 10 include a bulk mono-crystalline silicon substrate (or a layer grown thereon or otherwise formed therein). In various embodiments, the substrate 10 may include blanket epitaxial layers. In various embodiments, the substrate 10 may be a silicon wafer, a germanium wafer, or may be a compound semiconductor substrate including indium antimonide, indium arsenide, indium phosphide, gallium nitride, gallium arsenide, gallium antimonide or combinations thereof. In one embodiment, the substrate 10 may comprise a heteroepitaxial layer such as a gallium nitride grown on a silicon wafer.

The first mask 20 comprises a patterned or structured insulating layer in various embodiments. The first mask 20 may be a nitride in one embodiment. In another embodiment, the first mask 20 may be an oxide. The first mask 20 may be formed by thermal oxidation or nitridation, or using vapor deposition processes such as chemical vapor deposition, plasma vapor deposition.

The first mask 20 may comprise a hard mask material in one embodiment. In various embodiments, the first mask 20 may comprise a nitride material such as silicon nitride. In one or more embodiments, the first mask 20 comprises a pad oxide layer and a silicon nitride layer over the pad oxide layer. In an alternative embodiment, the first mask 20 comprises a pad oxide layer, and a silicon nitride layer over the pad oxide layer. In another alternative embodiment, the first mask 20 comprises a pad oxide layer, a nitride layer over the pad oxide layer, and a further oxide layer over the nitride layer. In another alternative embodiment, the first mask 20 comprises other materials such as carbon and amorphous materials as well.

In various embodiments, the first mask 20 may be fabricated using conventional lithography, for example, by depositing a photoresist layer over a mask layer and patterning the photoresist and the underlying mask layer. Alternatively, the first mask 20 may also be formed using other techniques such as stencil printing, and other patterning techniques.

Figure 1B:
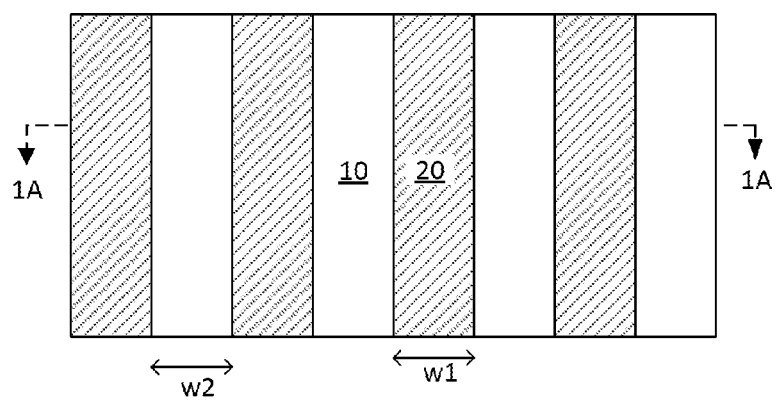

FIG. 1B illustrates an exemplary embodiment of the top view of the semiconductor substrate during fabrication.

As illustrated in FIG. 1B, the first mask 20 may cover about half the exposed area of the semiconductor substrate 10. For example, in one embodiment, the first width w1 of the patterned region of the first mask 20 is about the same as the second width w1 of the exposed semiconductor substrate 10.

Figure 2A:
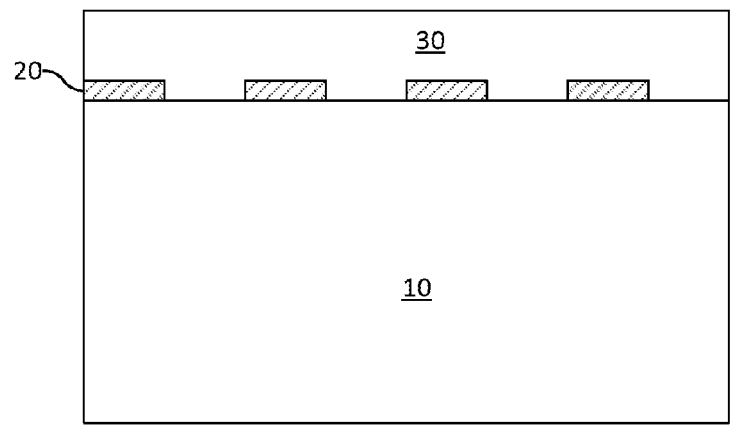

FIG. 2A illustrates the semiconductor device after forming an epitaxial lateral overgrowth layer in accordance with an embodiment of the present invention.

A first epitaxial lateral overgrowth layer 30 is grown on the exposed semiconductor substrate 10. In various embodiments, the first epitaxial lateral overgrowth layer 30 has the same material composition as the semiconductor substrate 10. In one embodiment, the first epitaxial lateral overgrowth layer 30 and the substrate 10 comprise silicon. For example, the silicon may have a (100) surface and the first epitaxial lateral overgrowth layer 30 also grows to have a (100) surface.

However, in some embodiments, the first epitaxial lateral overgrowth layer 30 may have a different composition than the substrate 10. In one embodiment, the substrate 10 may comprise a (111) silicon surface while the first epitaxial lateral overgrowth layer 30 may comprise gallium nitride. In a further embodiment, the first epitaxial lateral overgrowth layer 30 may comprise indium phosphide grown on a silicon substrate 10.

In various embodiments, the first epitaxial lateral overgrowth layer 30 is deposited using an epitaxial lateral overgrowth process, which is a method of epitaxial growth on a partially masked substrate. In one or more embodiments, the first epitaxial lateral overgrowth layer 30 may be grown using a liquid phase epitaxy process. In other embodiments, vapor phase epitaxy processes may also be used.

The epitaxial process nucleates in the opening between the first mask 20 and the growth proceeds in a direction normal to the substrate 10. After the growth surface grows beyond the first mask 20, the epitaxy occurs in the lateral direction over the first mask 20. Eventually adjacent portions of the epitaxial layer merge together to form a single layer comprising the first epitaxial lateral overgrowth layer 30. A relatively defect free first epitaxial lateral overgrowth layer 30 is formed advantageously due to the small nucleating surface.

In various embodiments, the first epitaxial lateral overgrowth layer 30 may be grown in multiple stages. In one embodiment, a first portion of the first epitaxial lateral overgrowth layer 30 is grown. For example, this first portion may have a thickness of up to one micron in one embodiment. The first portion is then annealed to minimize defects and improve the crystallinity of the first portion of the first epitaxial lateral overgrowth layer 30. In one embodiment, a laser annealing may be performed to produce a local heating of the first portion of the first epitaxial lateral overgrowth layer 30. In another embodiment, a flash anneal may be performed to minimize the thermal time of the annealing process while maximizing the peak temperature of the annealing. In one embodiment, the annealing may be performed by an anneal having a peak temperature of between 1000° C. to 1080° C. as an example.

Figure 2B:
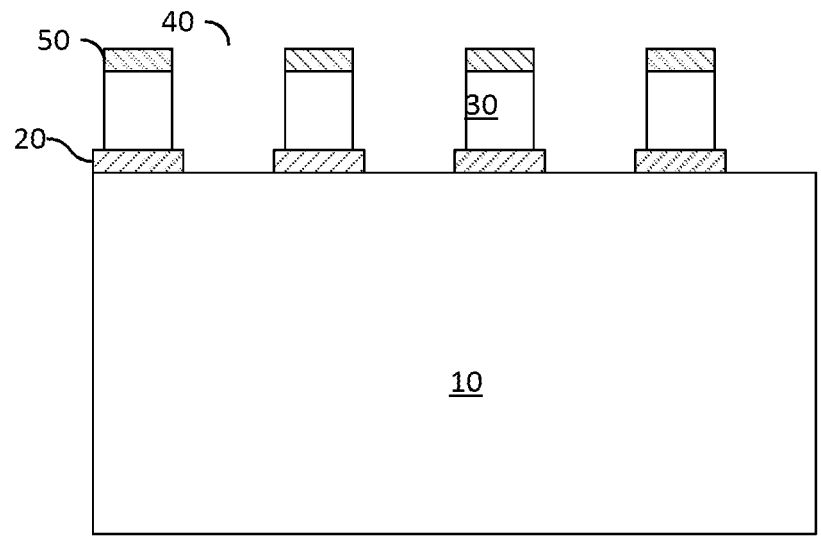

FIG. 2B illustrates the semiconductor device after forming a second mask and patterning the epitaxial lateral overgrowth layer in accordance with an embodiment of the present invention.

Referring to FIG. 2B, a second mask 50 is formed over the first epitaxial lateral overgrowth layer 30. The second mask 50 may be aligned with the first mask 20 such that the area between the first mask 20 is exposed. For this reason, the second mask 50 may be narrower than the first mask 20 (from a top view) thereby exposing some of the first mask 20 when an opening 40 is formed in the first epitaxial lateral overgrowth layer 30. Accordingly, alignment errors between the first mask 20 and the second mask 50 do not result in discontinuity in the buried isolation layer that is being formed.

Using the second mask 50 as an etch mask, openings 40 are formed in the first epitaxial lateral overgrowth layer 30. The etching may be a plasma process in one embodiment although other types of etching processes may also be used as long as anisotropic etching is obtained. Because a part of the underlying first mask 20 does not overlie the second mask 50, the etching process may be stopped by detecting when a region of the first mask 20 is beginning to be etched. In other words, when a surface of the first mask 20 is reached, the end point of the etching process can be detected.

Figure 2C:
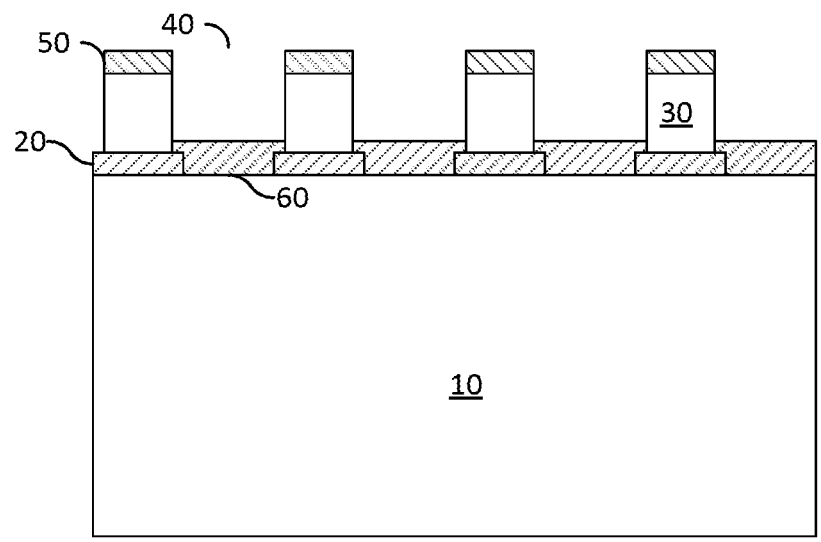

FIG. 2C illustrates the semiconductor device after forming an insulation layer between the openings in the second mask in accordance with an embodiment of the present invention.

As illustrated in FIG. 2C, an insulation layer 60 is formed between the second mask 50 in the openings 40. In various embodiments, the insulation layer 60 is formed only at the bottom surface of the openings 40.

In one embodiment, the insulation layer 60 comprises a thermal oxide. In alternative embodiments, the insulation layer 60 comprises a stack of materials including an oxide/nitride, oxide/nitride/oxide. In further embodiments, the insulation layer 60 comprises a nitride. In one embodiment, the first mask 20 and the insulation layer 60 comprise a same material.

In one embodiment, the insulation layer 60 is thicker than the first mask 20 so as to cover the exposed surface of the first mask 20. Covering the exposed surface of the first mask 20 ensures a continuous insulation region and avoids subsequent formation of cracks between the first mask 20 and the insulation layer 60.

In some embodiments, additionally, the insulation layer 60 covers the peripheral regions of the substrate 10 such as the outer peripheral region of the semiconductor wafer, the dicing streets between adjacent chips.

In one or more embodiments, the insulation layer 60 may be deposited to have a different strain than the first mask 20. For example, if the first mask 20 has a tensile stress, the insulation layer 60 may have a compressive stress.

An annealing process may be performed now or during subsequent fabrication to reflow the first mask 20, the insulation layer 60, or both layers so as to form a continuous buried insulation layer.

An aspect of the above process relates to the formation of the insulation layer 60 only at the bottom surface of the opening 40. Embodiments of the process of forming this layer will be described using magnified cross-sectional views of FIGS. 3 and 4.

FIGS. 3A-3E illustrate a method of forming an insulation layer at the bottom surface of the opening in accordance with embodiments of the present invention. The processes described in FIGS. 3A-3E may be one way to form the structure illustrated in FIG. 2C.

Figure 3A:
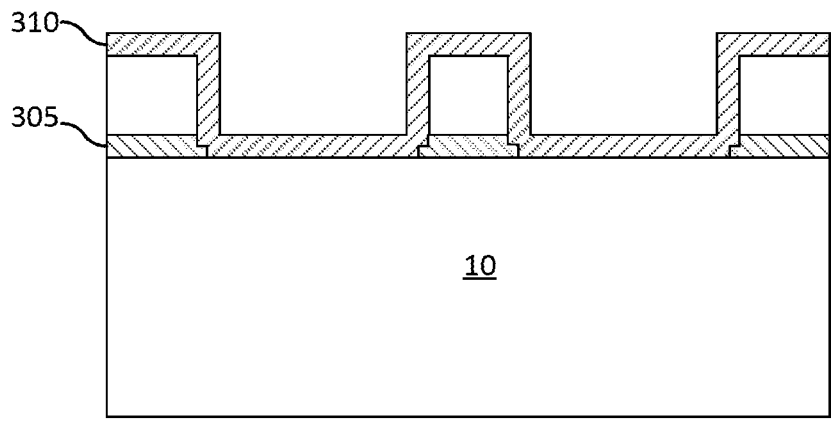

FIG. 3A illustrates a semiconductor device after forming a conformal liner in a high aspect ratio opening in accordance with an embodiment of the present invention.

An opening is formed in the substrate 10, for example, as described in FIGS. 1-2B. Referring to FIG. 3A, a conformal liner 310 is deposited over the opening, the substrate 10, and the buried mask layer 305 as illustrated. The conformal liner 310 may be an oxide grown using thermal oxidation or thermal nitridation in one embodiment. In alternative embodiments, the conformal liner 310 may be deposited using a conformal deposition process such as atmospheric pressure chemical vapor deposition (APCVD) or sub-atmospheric pressure chemical vapor deposition (SACVD) using organometallic precursors such as tetraethoxysilane (TEOS) and ozone gas chemistry. The reaction between TEOS and ozone deposits silicon oxide. In further alternative embodiments, the conformal liner 310 may be deposited using low pressure CVD (LPCVD), plasma enhanced CVD (PECVD), and others.

Figure 3B:
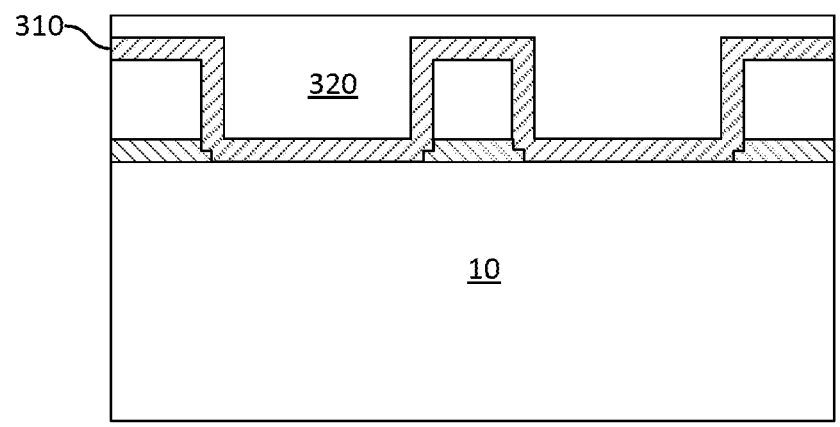

FIG. 3B illustrates a semiconductor device after forming a conformal liner in accordance with an embodiment of the present invention.

A fill material 320 is next deposited into the remaining opening. The fill material 320 may be a resist, carbon, imide, polymer, molding material, and other materials that are good at filling deep aspect ratio openings. The fill material 320 has a different etch selectivity than the conformal liner 310 so that both these materials may be independently removed by separate etching processes while exposing them to that particular etching process. The fill material 320 is made to overfill the openings as illustrated in FIG. 3B. Although not shown, the top surface of the fill material 320 may include roughness due to the underlying opening.

Figure 3C:
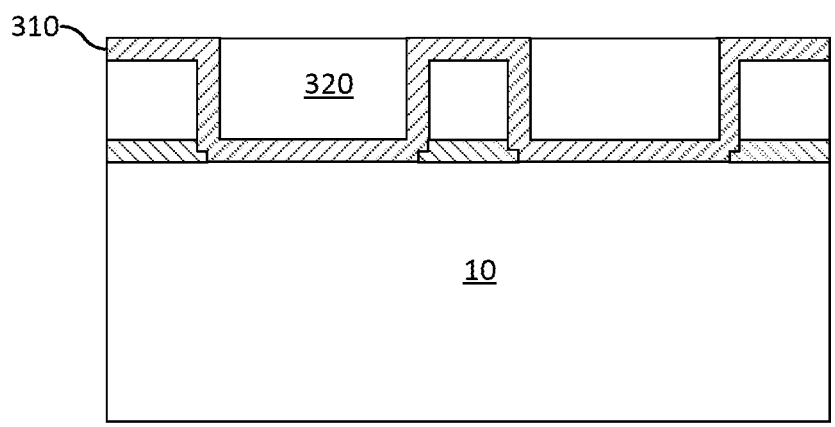

FIG. 3C illustrates a semiconductor device after polishing the fill material in accordance with an embodiment of the present invention.

A planarization process is used to polish the surface of the fill material 320. In one embodiment, the planarization process is stopped on the conformal liner 310. In an alternative embodiment, the planarization process may also etch through the conformal liner 310 to expose the substrate 10. In various embodiments, the planarization process may comprise a chemical mechanical polishing process.

In some embodiments, the overfilling and planarization may be skipped if the opening is partial filled using an alternative process.

Figure 3D:
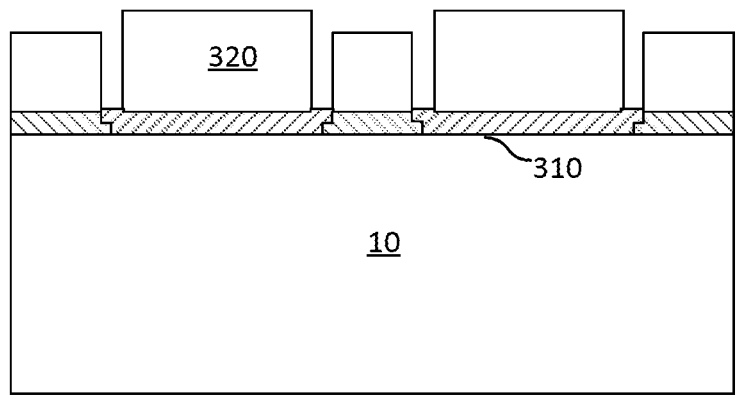

FIG. 3D illustrates a semiconductor device after etching the conformal liner in accordance with an embodiment of the present invention.

Referring to FIG. 3D, the exposed conformal liner 310 is etched using an etching process. In one embodiment, a timed wet etching process may be used. In another embodiment, a plasma etching process may be used. The etching process selectively removes the conformal liner 310 without etching the fill material 320.

Figure 3E:
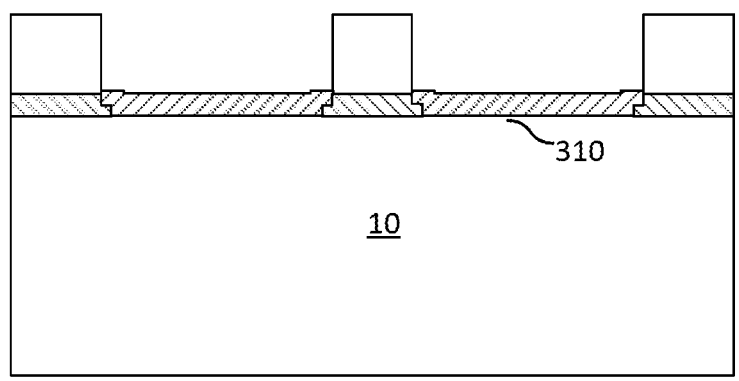

FIG. 3E illustrates a semiconductor device after removing the fill material in accordance with an embodiment of the present invention.

The exposed fill material 320 may now be etched without etching the conformal liner 310. In various embodiments, the fill material 320 is etched to expose the conformal liner 310. The etching process is selected so that the conformal liner 310 is not etched while etching the fill material 320. The conformal liner 310 may be used for end point detection in some embodiments.

Thus, a layer of the conformal liner 310 is left only at the bottom surface of the opening. Subsequent processing may follow as discussed in FIG. 5-6, or 10A-10B.

Figure 4:
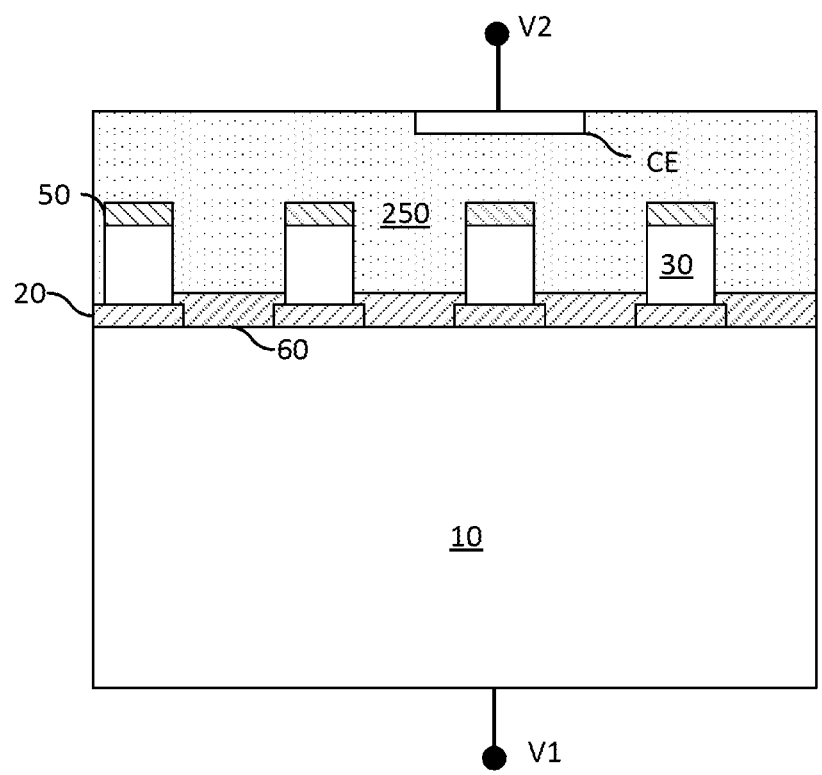

FIG. 4 illustrate an alternative method of forming an insulation layer at the bottom surface of the opening in accordance with embodiments of the present invention.

Unlike the embodiment described in FIGS. 3A-3E, in this embodiment, an insulation layer 60 is formed directly using an anodic process. If the first epitaxial lateral overgrowth layer 30 is electrically insulated by the first mask 20, only the surface of the substrate 10 is electrically charged if a potential is applied to the substrate 10. In such cases, an anodic oxidation process may be used to selectively oxidize the exposed surface of the substrate 10 in the opening 40.

A positive voltage may be applied to the substrate 10 and a relative negative potential is applied to the electrolyte 250 through the cathode electrode (CE). The exposed wafer surface forms the anode for the electrolytic process. In one or more embodiments, the electrolyte 250 may comprise nitric acid and water. An annealing process may be performed following the anodic oxidation process. Again, subsequent processing may follow as discussed in FIG. 5-6, or 10A-10B.

Figure 5:
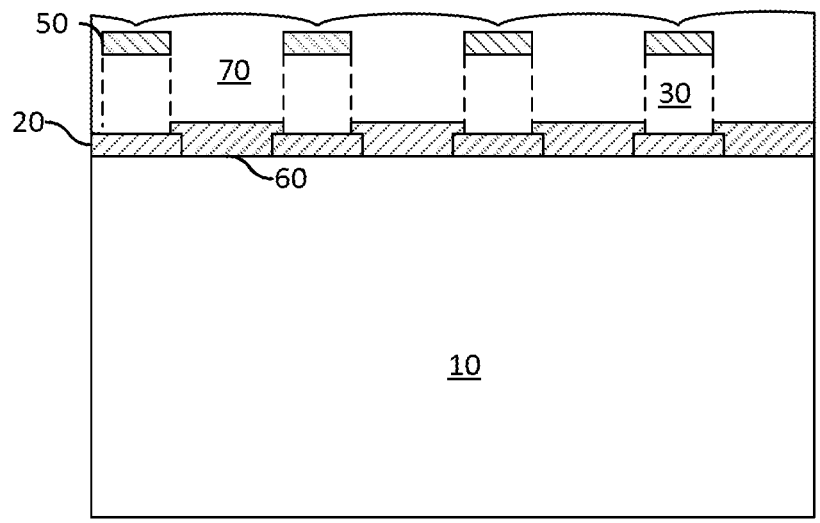

FIG. 5 illustrates the semiconductor device after forming another epitaxial lateral overgrowth layer between the openings in the second mask in accordance with an embodiment of the present invention.

Continuing from FIG. 2C, using the exposed sidewalls of the first epitaxial lateral overgrowth layer 30, a second epitaxial lateral overgrowth layer 70 is grown. The second epitaxial lateral overgrowth layer 70 is isolated from the substrate 10 by the insulation layer 60. The overlap between the insulation layer 60 and the first mask 20 ensures that no surface of the substrate 10 is exposed, which would otherwise produce stringers electrically connected to the substrate 10.

The second epitaxial lateral overgrowth layer 70 fills the openings 40 and thereby forms a single layer over the substrate 10. The second epitaxial lateral overgrowth layer 70 may be allowed to overfill so that growth proceeds laterally over the second mask 50. The growth of the second epitaxial lateral overgrowth layer 70 nucleates from the sidewalls of the first epitaxial lateral overgrowth layer 30 and adjacent surfaces merge together. Accordingly, epitaxial material from adjacent openings 40 coalesce together to form the single layer of the second epitaxial lateral overgrowth layer 70. A subsequent anneal may be performed to improve the crystallinity of this layer.

Figure 6:
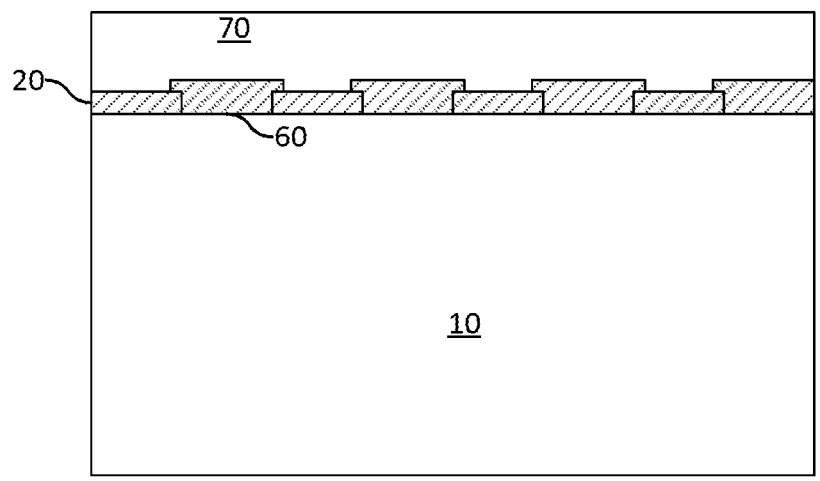

FIG. 6 illustrates the semiconductor device after planarization of the second epitaxial lateral overgrowth layer in accordance with an embodiment of the present invention.

The second epitaxial lateral overgrowth layer 70 is planarized to form a planar surface. The planarization may be performed using a chemical mechanical polishing process in various embodiments. The planarization process may be used to also remove the second mask 50 in one or more embodiments. Alternatively, a separate etching process may be used to remove the second mask 50.

Figure 7A:
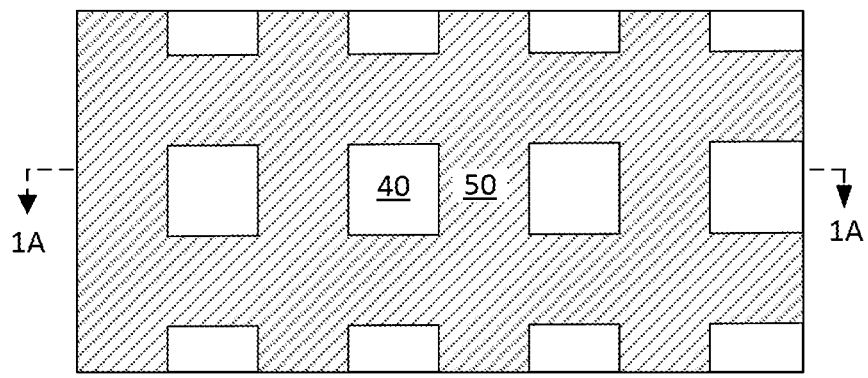
FIG. 7A illustrates a top sectional view of the opening of the semiconductor device before being filled with the second epitaxial overgrowth layer in accordance with an embodiment of the present invention.

FIG. 7A illustrates a top sectional view of the opening of the semiconductor device before being filled with the second epitaxial overgrowth layer in accordance with an embodiment of the present invention.

In various embodiments, the first mask may have various shapes and density over the substrate 10. In one embodiment as illustrated in FIG. 7B, the first mask and subsequently the openings 40 are made such that the openings 40 are shaped like contact holes.

Figure 7B:
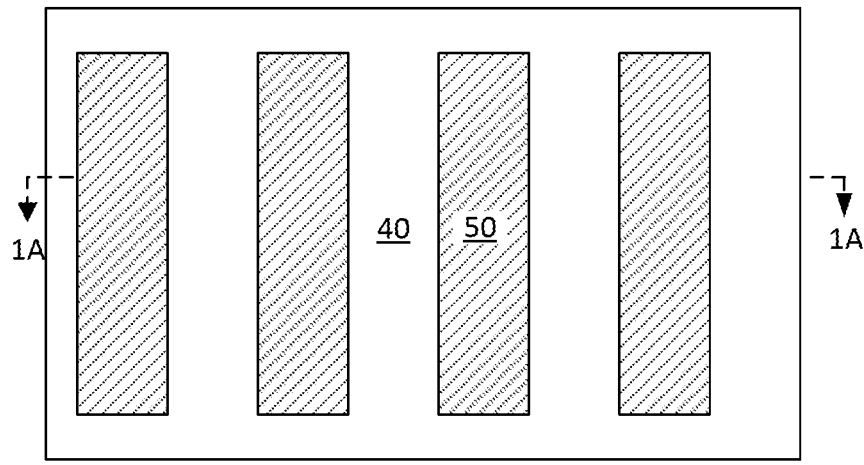
FIG. 7B illustrates a top sectional view of the opening of the semiconductor device before being filled with the second epitaxial overgrowth layer in accordance with an embodiment of the present invention.

FIG. 7B illustrates a top sectional view of the opening of the semiconductor device before being filled with the second epitaxial overgrowth layer in accordance with an embodiment of the present invention.

Referring to FIG. 7B, the openings 40 are formed in the peripheral region of the substrate 10. For example, when the substrate 10 is a semiconductor wafer, the outer peripheral region of the semiconductor wafer comprises the openings 40 over which the second epitaxial lateral overgrowth layer 70 may be grown.

Figure 7C:
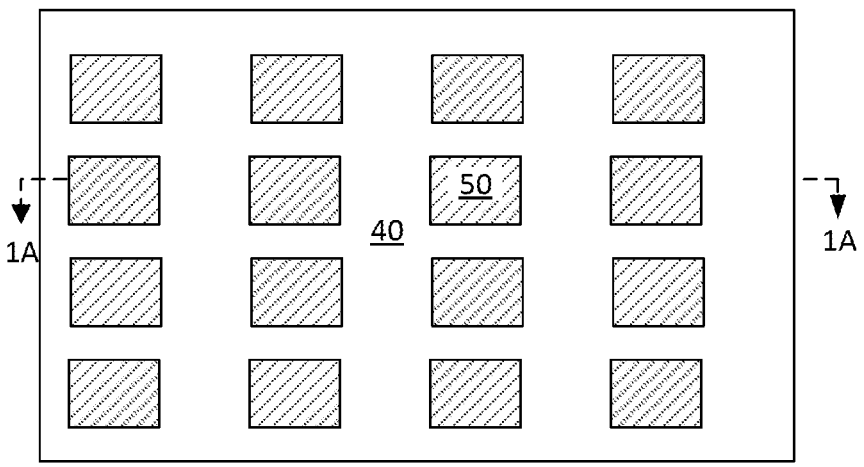
FIG. 7C illustrates a top sectional view of the opening of the semiconductor device before being filled with the second epitaxial overgrowth layer in accordance with an embodiment of the present invention.

FIG. 7C illustrates a top sectional view of the opening of the semiconductor device before being filled with the second epitaxial overgrowth layer in accordance with an embodiment of the present invention.

As illustrated in FIG. 7C, in one embodiment, the first mask 20 (and the second mask 50) is formed as pillars over the substrate 10. In various embodiments, the openings 40 may take up 20% to 80% of the surface area of the major surface of the substrate 10.

The above embodiments of FIG. 7A-7C may be applied to any of the other embodiments described above and below.

Figure 8:
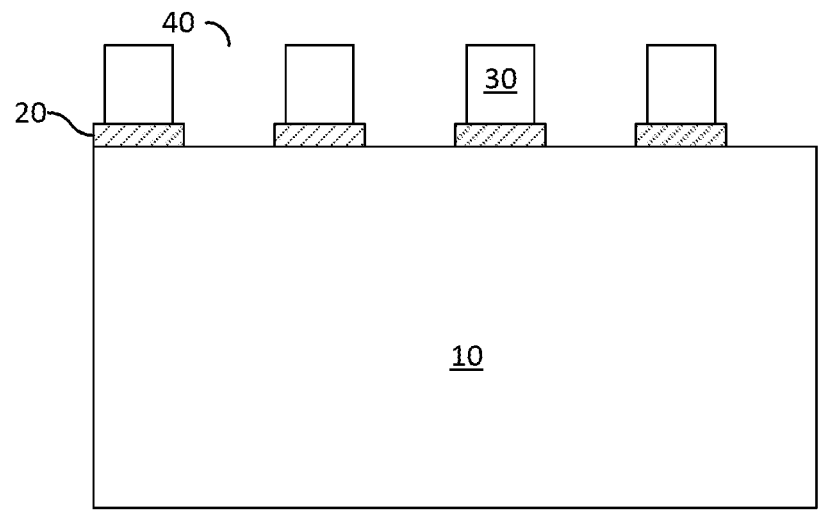
Figure 9:
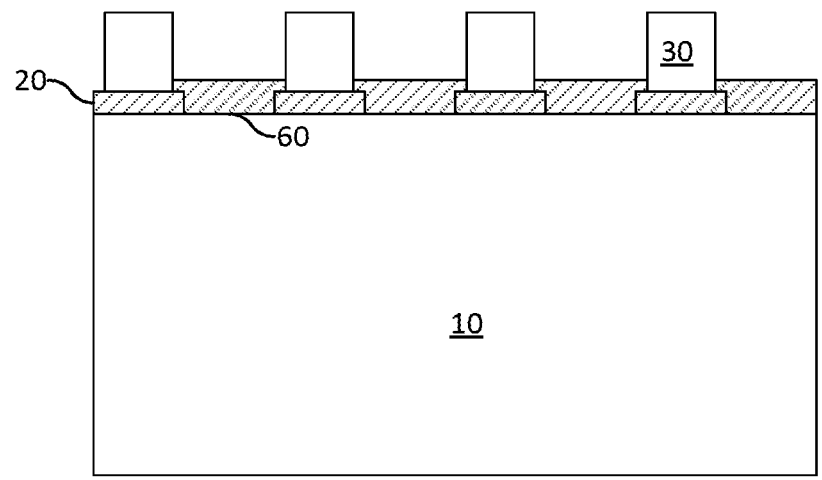

FIGS. 8-10 illustrates a semiconductor device during various stages of fabrication in accordance with embodiments of the present invention. Embodiments of the present invention may be used to form a buried cavity above the substrate 10 as will be described below.

FIG. 8 illustrates the semiconductor device after removing the insulation layer in accordance with an embodiment of the present invention.

The process follows the description described in FIGS. 1, 2A, and 2B. Accordingly, a first mask 20 is structured, the first epitaxial lateral overgrowth layer 30 is grown and patterned using the second mask 50 to form openings 40 as described above in various embodiments.

Referring to FIG. 8, unlike FIG. 2C, the second mask 50 is removed before beginning the additional epitaxial lateral overgrowth process.

FIG. 9 illustrates the semiconductor device after forming an insulation layer at the bottom of the openings in accordance with an embodiment of the present invention.

After removing the insulating layer, an insulation layer 60 is formed at the bottom surface of the openings 40 as described in other embodiments (e.g., FIGS. 3 and 4 above). In one embodiment, the insulation layer 60 comprising an oxide, oxide/nitride, or an oxide/nitride/oxide stack is formed at the bottom of the openings 40 as described in various embodiments.

Figure 10A:
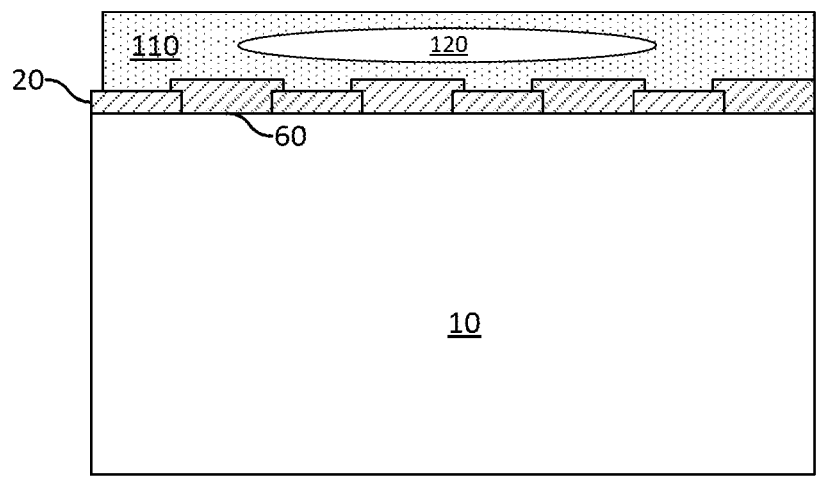
FIGS. 10A and 10B illustrate the semiconductor device after forming a cavity embedded within the epitaxial layer in accordance with an embodiment of the present invention.
Figure 10B:
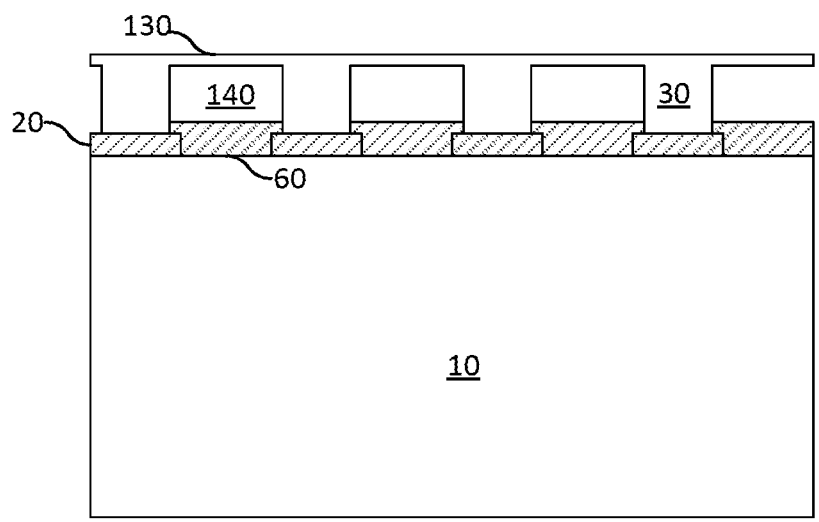

FIGS. 10A and 10B illustrate the semiconductor device after forming a cavity embedded within the epitaxial layer in accordance with an embodiment of the present invention.

In one embodiment, a process for forming cavities in the epitaxial layer is described, although other processes may be used in other embodiments. In one exemplary cavity forming process, three dimensional (3-D) structures are generated and exposed to a high temperature process in an ambient that includes a diffusion enhancing element, resulting in a closure of the upper parts of the 3-D structures and the associated formation of voids, which are completely sealed by the substrate 10, which may be a single crystal substrate as described previously. When the substrate 10 comprises single crystal silicon, the diffusion enhancing element may be hydrogen, which enhances the solid state diffusion of silicon atoms resulting in a rearrangement of the crystalline substrate 10. In one embodiment, the substrate 10 comprising the openings 40 is exposed to a hydrogen atmosphere and annealed. For example, the annealing may be performed between 400° C. to 550° C. in various embodiments.

The atoms of the first epitaxial lateral overgrowth layer 30 rearrange during the hydrogen annealing to form a buried cavity 120 within the epitaxial layer 110 as illustrated in FIG. 10A. Advantageously, the buried cavity 120 and the epitaxial layer 110 are isolated from the substrate 10.

In an alternative embodiment, the Venecia process is performed such that a bridge-like upper layer 130 is created along the upper portion of the openings 40 leaving a plurality of cavities 140. This is illustrated in FIG. 10B.

Accordingly, further processing may be continued to form device structures. Example of structures that may be opto-electronic devices, devices having moving components such as MEMS devices, and others.

FIGS. 11-19 illustrate a semiconductor device during various stages of fabrication in accordance with an alternative embodiment of the present invention.

In further embodiments, a buried oxide may be performed using isotropic etching processes as further described using FIGS. 11-19. This embodiment may include process steps similar to the prior embodiments.

Figure 11:
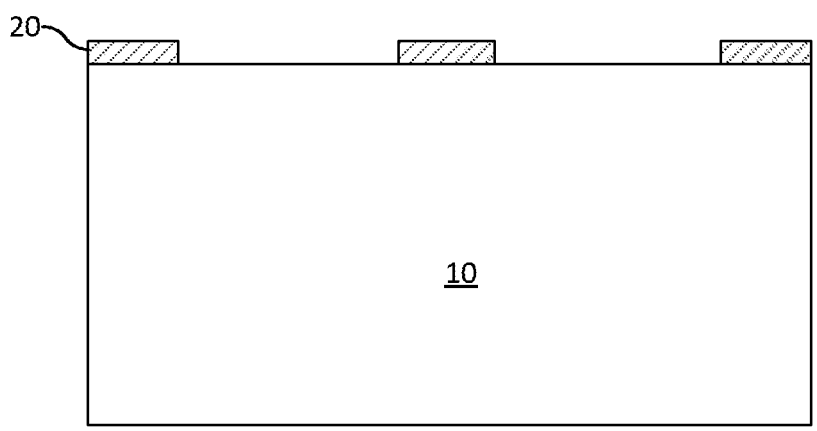

FIG. 11 illustrates the semiconductor device after forming an etch mask over the substrate in accordance with an embodiment of the present invention. As illustrated in FIG. 11, a first mask 20 is formed over a substrate 10. The first mask 20 may be formed as described in prior embodiments.

Figure 12:
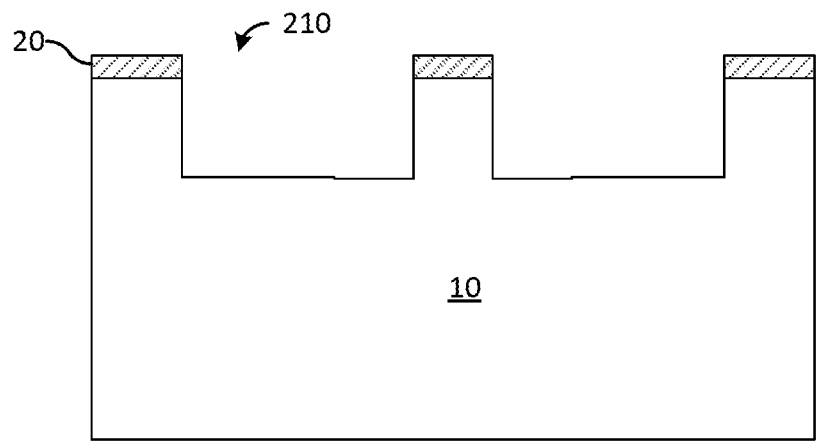

FIG. 12 illustrates the semiconductor device after forming deep openings in the substrate in accordance with an embodiment of the present invention.

Next, as illustrated in FIG. 12, similar to prior embodiments, a deep opening 210 is formed in the substrate 10. The deep opening 210 may be a trench in one embodiment. In another embodiment, the deep opening 210 may be shaped like a contact hole so that the length and width of the deep opening 210 are similar. In various embodiments, the deep opening 210 may be formed using a plasma process although other anisotropic process may be used in various embodiments.

Figure 13:
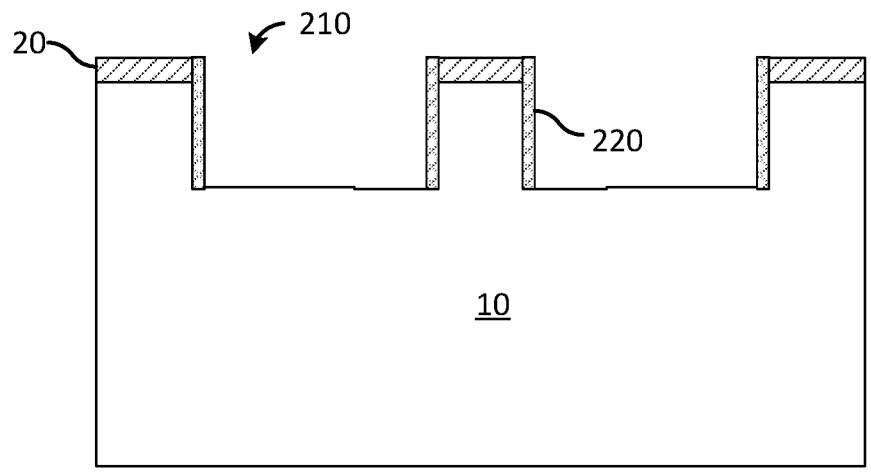

FIG. 13 illustrates the semiconductor device after passivating the sidewalls of the deep opening in accordance with an embodiment of the present invention.

Referring next to FIG. 13, the sidewalls of the deep opening 210 are passivated with a sidewall spacer 220. The sidewall spacer 220 may be formed by depositing a liner, which may be an oxide, nitride, or a combination of oxide and nitride, or a stack comprising one or more layers of oxide and nitride, in the trench. The liner is etched in the area of the trench bottom using an anisotropic process to form the sidewall spacer 220. The anisotropic process may be a reactive ion etching process in one embodiment.

Figure 14:
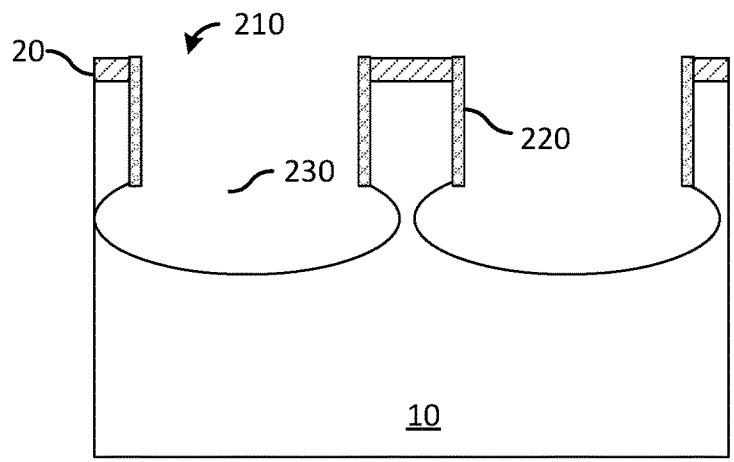

FIG. 14 illustrates the semiconductor device after an isotropic etching process in accordance with an embodiment of the present invention.

As next illustrated in FIG. 14, an isotropic etching process may be used to form lower openings 230. The isotropic etching process may be a wet etching process. In some embodiments, the isotropic etching process may comprise a dry etching process including an isotropic plasma etching process.

Figure 15:
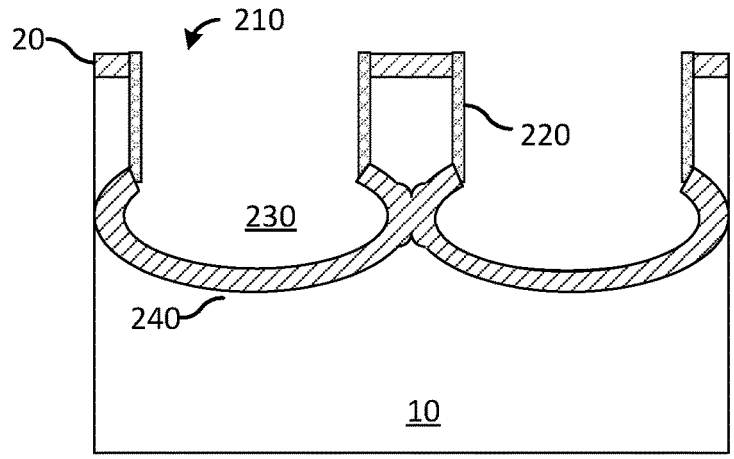

FIG. 15 illustrates the semiconductor device after forming a sidewall liner on the lower openings in accordance with an embodiment of the present invention.

As will be described using FIGS. 15-18, the lower openings 230 is filled with an insulating material. In one embodiment, this may be performed using a single dry or wet oxidation process. In some embodiments, this may be performed using multiple process steps as further described herein. A thermal oxidation process may be used to oxidize the exposed surfaces of the lower opening 230. The silicon-consumimg oxidation process is performed until the oxide liner 240 from adjacent lower openings 230 merge together forming a continuous liner layer as illustrated in FIG. 15.

Figure 16:
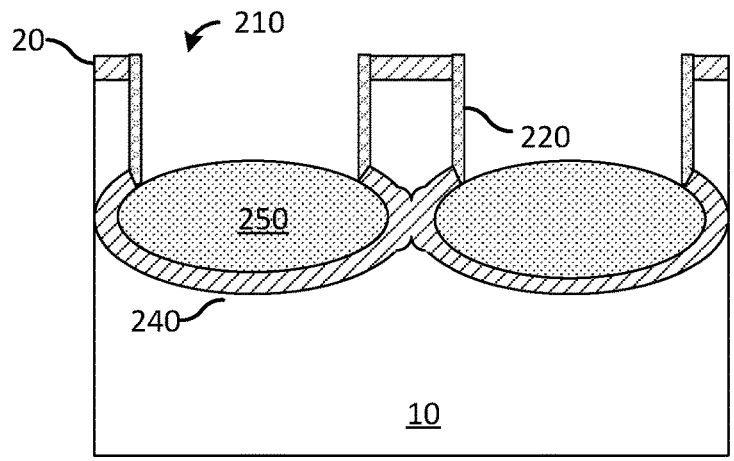

FIG. 16 illustrates the semiconductor device after filling the lower openings in accordance with an embodiment of the present invention.

Referring to FIG. 16, an insulating fill material 250 may be used to fill the lower openings 230. The insulating fill material 250 may comprise a low-k dielectric material, oxide, or a nitride in various embodiments. The insulating fill material 250 may be material that is able to fill into high aspect ratio openings without leaving voids or cavities. For example, the insulating fill material 250 may be chosen to have good reflow properties so that it reflows during deposition or during a subsequent reflow anneal.

Figure 17:
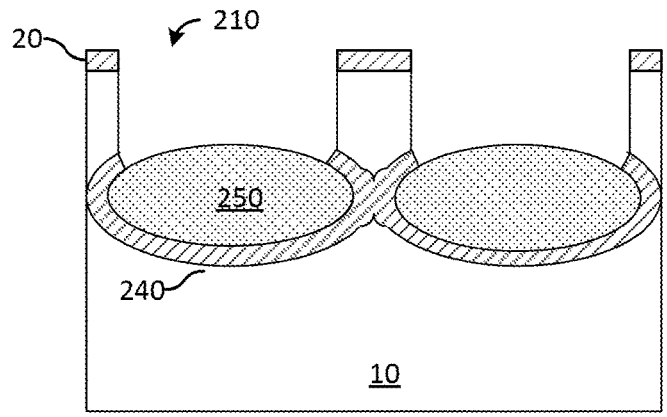

FIG. 17 illustrates the semiconductor device after removing the sidewall passivation from the deep opening in accordance with an embodiment of the present invention.

The sidewall spacer 220 is removed using an etching process such as a wet etching process. The sidewall spacer 220 may be selectively removed without removing the insulating fill material 250 in one embodiment.

Figure 18:
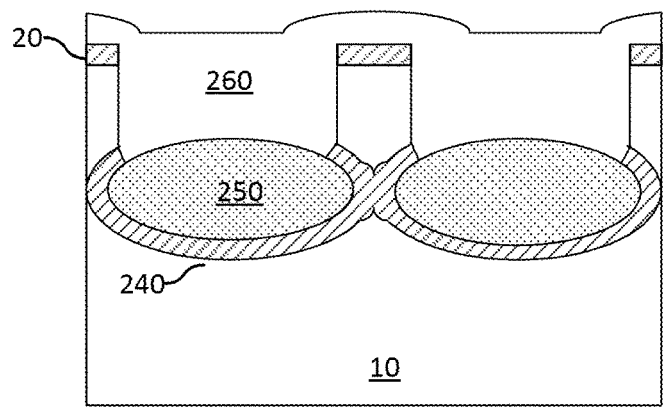

FIG. 18 illustrates the semiconductor device after filling the deep opening with a epitaxial lateral overgrowth layer in accordance with an embodiment of the present invention.

An epitaxial lateral overgrowth process is used to grow the epitaxial fill region 260.

The epitaxial layer nucleates from the exposed sidewalls of the substrate 10.

Figure 19:
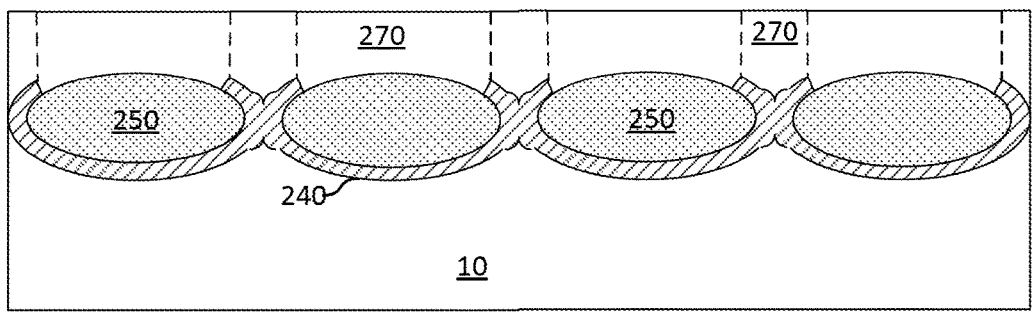

FIG. 19 illustrates the semiconductor device after planarization in accordance with an embodiment of the present invention.

Subsequent processing including planarization of the epitaxial fill region 260 may proceed as described in prior embodiments, for example, using a chemical mechanical planarization process to form the epitaxial layer 270. The epitaxial layer 270 is isolated from the underlying substrate 10 by the series of interconnected bubble shaped isolation regions. The underlying first mask 20 may be removed during the planarization. Further processing may continue as in conventional semiconductor fabrication to produce the desired device structure in the epitaxial layer 270.

Embodiments of the present invention may be used in many applications. Some exemplary applications will be described below without narrowing the scope of the invention to only these applications. These are provided to serve only as examples.

Figure 20:
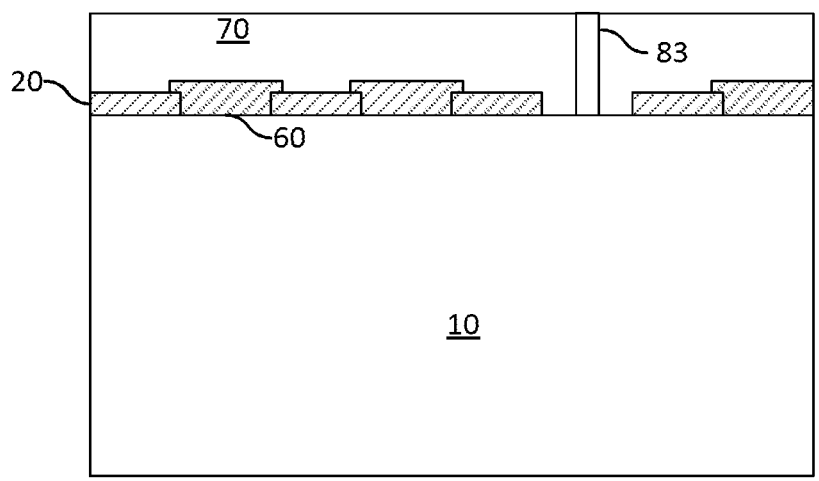
FIG. 20 illustrates the possibility of forming contact vias to the substrate in accordance with an embodiment of the present invention.

FIG. 20 illustrates the possibility of forming contact vias to the substrate in accordance with an embodiment of the present invention.

In one or more embodiments, some openings between the first mask 20 are masked while forming the insulation layer 60 or alternatively are removed locally in that area after the generation of layer 60. Consequently, the first epitaxial lateral overgrowth layer 30 or the second epitaxial lateral overgrowth layer 70 fills these spaces. A contact 83 may be made through this opening in the first mask 20 so as to contact the underlying substrate 10. This solves an important problem with conventional SOI substrates.

Figure 21:
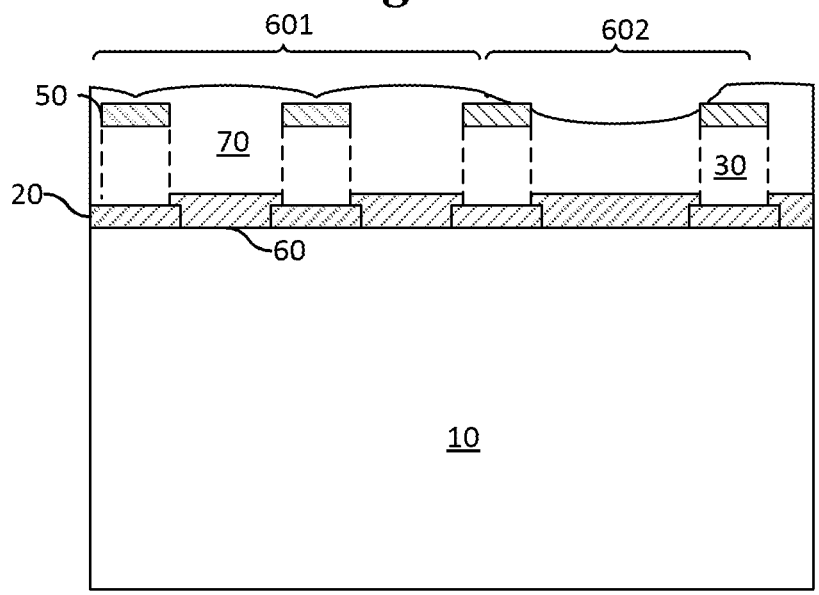
FIG. 21 illustrates thinner epitaxial regions at dicing streets in accordance with an embodiment of the present invention.

FIG. 21 illustrates thinner epitaxial regions at dicing streets in accordance with an embodiment of the present invention.

In alternative embodiments, the distance between adjacent openings may be larger in the dicing streets 602 relative to the chip regions 601 so that the laterally growing epitaxial layers preferentially don't touch each other in that area. In one embodiment, the distance between adjacent openings is 10% larger in the dicing streets 602 relative to the chip regions 601. Thus, the thickness of the second epitaxial overgrowth layer 70 (or a subsequent epitaxial layer) is less at the dicing streets 602 than the chip regions 601 as illustrated. The thinner second epitaxial overgrowth layer 70 is easier to cut through during a dicing process that is performed at the end of processing. In further embodiments, after forming the second epitaxial overgrowth layer 70, a filler material may be deposited so as to fill the unfilled portions in the dicing streets 602. Examples of the filler may include materials such as carbon, epoxy, resists, molding compounds, and others.

In various embodiments, the buried oxide layers thus formed may also be used as a thinning stop layer so as to produce wafers having a constant thickness thereby minimizing wafer to wafer thickness variations. The buried oxide layers function as a self-adjusting thinning stop layer for the thinning process performed from the backside. In other examples, the buried oxide layers may be used as a stop during back etching, for example, by wet etching in, e.g., KOH or TMAH, or CMP, or other grinding.

Figure 22A:
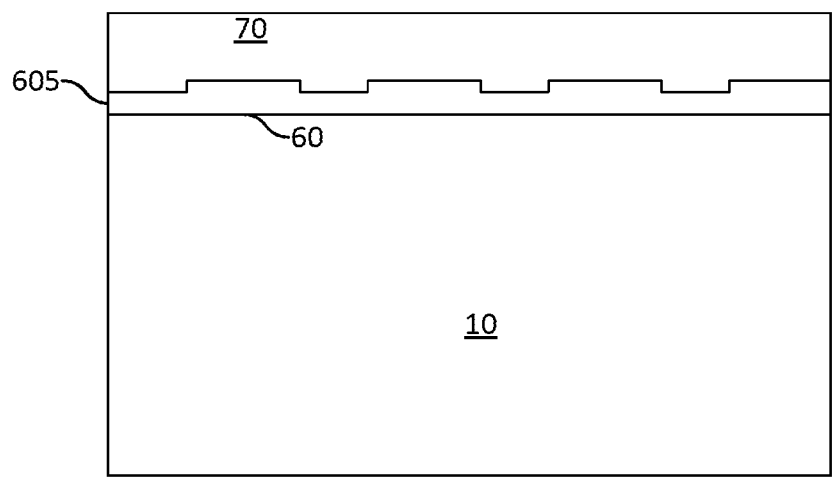
FIG. 22A-22B illustrate the semiconductor device after a release etch resulting in a suspending structure comprising the epitaxial layer in accordance with an embodiment of the present invention.
Figure 22B:
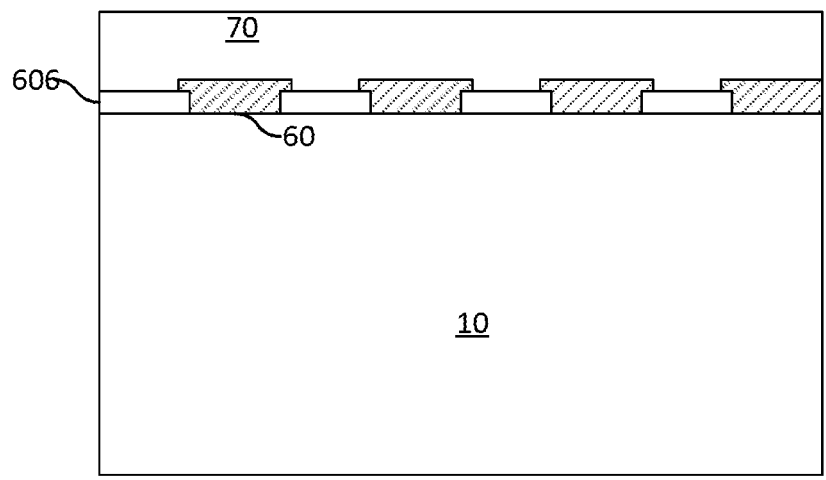

FIG. 22A-22B illustrate the semiconductor device after a release etch resulting in a suspending structure comprising the epitaxial layer in accordance with an embodiment of the present invention.

Embodiments of the present invention may be used to create microelectromechanical system (MEMS) devices. FIG. 22A illustrates one embodiment in which the continuous buried insulation layer has been etched away, for example, using hydrofluoric acid, to form a cavity 605 and an overlying second epitaxial overgrowth layer 70. In some embodiments, the insulation layer 60 may have a different composition and therefore etch selectivity to the first mask 20. Therefore, the insulation layer 60 or the first mask 20 may be selectively etched as shown in FIG. 22B to form buried cavities 606.

Figure 23A:
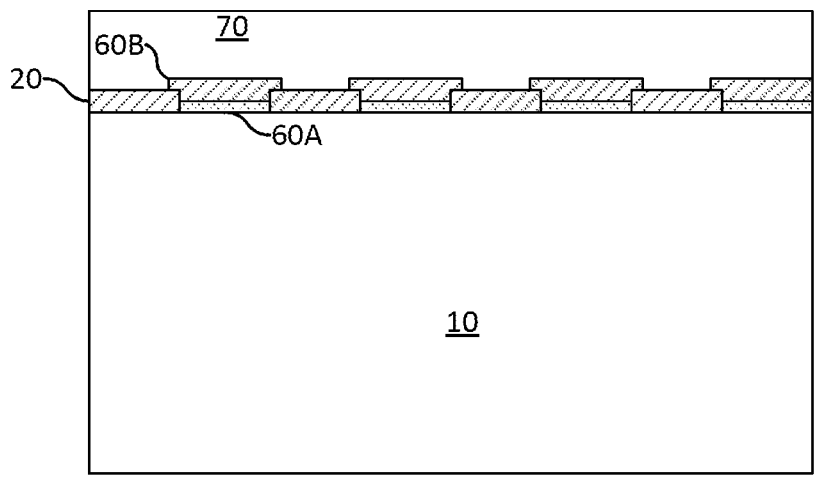
FIG. 23A-23B illustrate the semiconductor device using multiple layers for the buried isolation region in accordance with an embodiment of the present invention.
Figure 23B:
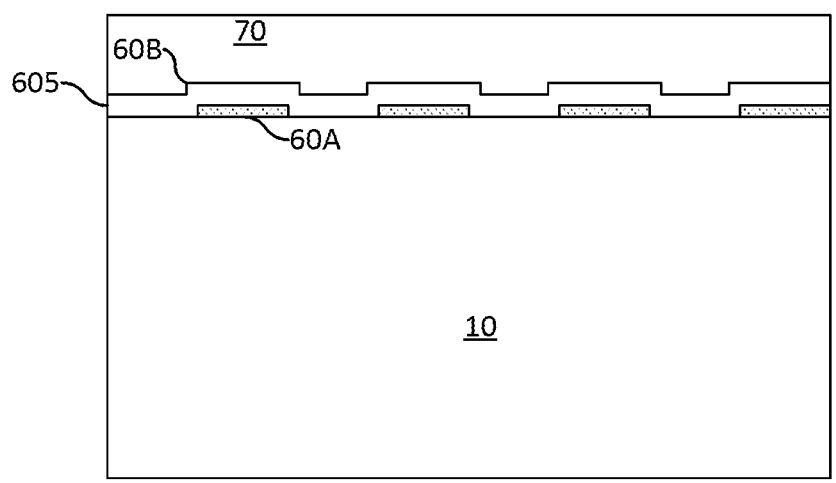

FIG. 23A-23B illustrate the semiconductor device using multiple layers for the buried isolation region in accordance with an embodiment of the present invention.

As described previously, either the first mask 20 or the insulation layer 60 may be comprises of multiple layers. For illustration, the insulation layer 60 includes a first layer 60A on which the second layer 60B has been deposited. The first layer 60A may be a different material than the second layer 60B. For example, in one embodiment, the first layer 60A is an nitride and the second layer 60B is an oxide. Such structures may have many applications.

FIG. 23B illustrates one exemplary application in which one of the layers of the insulation layer is etched in accordance with an embodiment of the present invention. Referring to FIG. 23B, the second layer 60B and the first mask 20 are etched to form a continuous buried cavity 605 in one embodiment.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating a semiconductor device, the method comprising:
    forming a first mask over a semiconductor substrate and growing a first semiconductor material from between the first mask to form a first epitaxial lateral overgrowth region;
    forming an opening in the first epitaxial lateral overgrowth region to expose a surface of the semiconductor substrate within the opening;
    forming an insulation region at the exposed surface of the semiconductor substrate within the opening, wherein the insulation region overlaps with a portion of the first mask; and using a lateral epitaxial growth process, filling the opening with a second semiconductor material to form a second epitaxial lateral overgrowth region;

while forming the opening, forming a second opening in one of the first epitaxial lateral overgrowth region to expose another surface of the semiconductor substrate within the second opening, wherein the opening is formed in a chip region and the second opening is formed in a dicing street, and wherein the opening has a first critical opening size and the second opening has a second critical opening size, wherein the first critical opening size is smaller than the second critical opening size; and filling the second opening with the second semiconductor material using the lateral epitaxial growth process, wherein a thickness of the second semiconductor material in the dicing street is less than a thickness of the second semiconductor material in the chip region.

2. The method of claim 1, wherein growing the first semiconductor material comprises using a lateral epitaxial growth process.

3. The method of claim 1, wherein forming the opening further comprises:
forming a second mask aligned to the first mask; and
etching the opening using the second mask as an etch mask.

4. The method of claim 1, wherein the first mask and the insulation region form a continuous isolation region.

5. The method of claim 1, wherein the first mask and the insulation region comprise different materials.

6. The method of claim 1, wherein the first semiconductor material and the semiconductor substrate comprise a different semiconductor material.

7. The method of claim 1, wherein the first semiconductor material and the second semiconductor material comprise a same semiconductor material.

8. The method of claim 1, further comprising:
forming a second opening in one of the first epitaxial lateral overgrowth region to expose another surface of the semiconductor substrate within the second opening; and
filling the second opening with a conductive material to form a contact via to the semiconductor substrate.

9. The method of claim 3, further comprising:
etching the second mask after filling the opening with the second semiconductor material.

10. The method of claim 1, wherein the insulation region comprises a stack of layers of an oxide and a nitride.

11. The method of claim 1, wherein forming the insulation region at the exposed surface of the semiconductor substrate within the opening comprises:
forming a conformal liner along sidewalls of the opening and exposed surface of the semiconductor substrate within the opening;
filling the opening with a sacrificial material, the sacrificial material covering the conformal liner at the exposed surface of the semiconductor substrate within the opening;
removing the conformal liner from the sidewalls; and
removing the sacrificial material.

12. The method of claim 1, wherein forming the insulation region at the exposed surface of the semiconductor substrate within the opening comprises selectively oxidizing the exposed surface of the semiconductor substrate within the opening.

13. A method for fabricating a semiconductor device, the method comprising:

forming a plurality of mask regions over a semiconductor substrate, the plurality of mask regions exposing portions of the semiconductor substrate while covering other portions of the semiconductor substrate;

using a lateral epitaxial growth process, forming an epitaxial lateral overgrowth region through the exposed portions of the semiconductor substrate;

forming a second plurality of mask regions over the epitaxial lateral overgrowth region;

using the second plurality of mask regions, forming a plurality of openings and a plurality of pillars in the epitaxial lateral overgrowth region, wherein the plurality of openings comprise a first opening in a chip region and a second opening in a dicing street, and wherein the first opening has a first critical opening size and the second opening has a second critical opening size, wherein the first critical opening size is smaller than the second critical opening size;

depositing a plurality of isolation regions, wherein the plurality of isolation regions and the plurality of mask regions form a continuous isolation layer;

removing the second plurality of mask regions;

forming an epitaxial region by epitaxially growing from the plurality of pillars, wherein a thickness of the epitaxial region in the dicing street is less than a thickness of the epitaxial region in the chip region; and forming a buried cavity in the epitaxial region.

14. The method of claim 13, wherein forming the buried cavity comprises annealing in a hydrogen atmosphere.

15. The method of claim 13, wherein the plurality of openings are aligned to be between the plurality of mask regions.

16. The method of claim 13, wherein forming the buried cavity comprises rearranging the plurality of pillars to form the buried cavity.

17. The method of claim 13, wherein forming the buried cavity comprises forming a bridge connecting over the plurality of openings.

18. The method of claim 13, wherein the buried cavity is isolated from the substrate by the continuous isolation layer.

19. A method for fabricating a semiconductor device, the method comprising:
forming a first mask over a semiconductor substrate and growing a first semiconductor material from between the first mask to form a first epitaxial lateral overgrowth region;

forming an opening in the first epitaxial lateral overgrowth region to expose a surface of the semiconductor substrate within the opening, wherein while forming the opening in the first epitaxial lateral overgrowth region, forming a second opening in the first epitaxial lateral overgrowth region to expose another surface of the semiconductor substrate within the second opening, wherein the opening is formed in a chip region and the second opening is formed in a dicing street;

forming an oxide region at the exposed surface of the semiconductor substrate within the opening, wherein the oxide region overlaps with a portion of the first mask, wherein the first mask is between the overlapping oxide region and the semiconductor substrate; and using a lateral epitaxial growth process, filling the opening with a second semiconductor material to form a second epitaxial lateral overgrowth region, and filling the second opening with the second semiconductor material using the lateral epitaxial growth process.

20. The method of claim 19, wherein the opening has a first critical opening size and the second opening has a second critical opening size, wherein the first critical opening size is smaller than the second critical opening size.

21. The method of claim 19, wherein a thickness of the second semiconductor material in the dicing street is less than a thickness of the second semiconductor material in the chip region.

22. A method for fabricating a semiconductor device, the method comprising:
   forming a plurality of mask regions over a semiconductor substrate, the plurality of mask regions exposing portions of the semiconductor substrate while covering other portions of the semiconductor substrate;
   using a lateral epitaxial growth process, forming an epitaxial lateral overgrowth region through the exposed portions of the semiconductor substrate;
   forming a plurality of openings and a plurality of pillars in the epitaxial lateral overgrowth region, wherein forming the plurality of openings comprises forming a first opening and a second opening in the epitaxial lateral overgrowth region, wherein the first opening is formed in a chip region and the second opening is formed in a dicing street, and wherein the first opening has a first critical opening size and the second opening has a second critical opening size, wherein the first critical opening size is smaller than the second critical opening size; and
   filling the first opening and the second opening with a second semiconductor material using the lateral epitaxial growth process, wherein a thickness of the second semiconductor material in the dicing street is less than a thickness of the second semiconductor material in the chip region; and
   forming a buried cavity in the epitaxial lateral overgrowth region, wherein forming the buried cavity comprises rearranging the plurality of pillars to form the buried cavity.

23. The method of claim 22, further comprises:
   after forming the plurality of openings, forming a plurality of insulation regions at a bottom portion of the plurality of openings.

24. The method of claim 22, wherein forming the buried cavity comprises annealing in a hydrogen atmosphere.

25. The method of claim 22, wherein the plurality of openings are aligned to be between the plurality of mask regions.

* * * * *